United States Patent
Kamplain

(10) Patent No.: US 10,079,328 B2
(45) Date of Patent: Sep. 18, 2018

(54) SEMICONDUCTOR NANOCRYSTALS, A METHOD FOR PREPARING A SEMICONDUCTOR NANOCRYSTAL, AND PRODUCT INCLUDING SAME

(71) Applicant: SAMSUNG ELECTRONICS CO., LTD., Suwon-si (KR)

(72) Inventor: Justin W. Kamplain, Bartlesville, OK (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/180,630

(22) Filed: Jun. 13, 2016

(65) Prior Publication Data
US 2017/0069786 A1  Mar. 9, 2017

Related U.S. Application Data

(60) Provisional application No. 62/204,890, filed on Aug. 13, 2015.

(51) Int. Cl.
| | |
|---|---|
| *H01L 33/06* | (2010.01) |
| *C22C 30/06* | (2006.01) |
| *C22C 1/00* | (2006.01) |
| *H01L 33/26* | (2010.01) |

(52) U.S. Cl.
CPC .............. *H01L 33/06* (2013.01); *C22C 1/00* (2013.01); *C22C 30/06* (2013.01); *H01L 33/26* (2013.01)

(58) Field of Classification Search
None
See application file for complete search history.

(56) References Cited

U.S. PATENT DOCUMENTS

| | | | |
|---|---|---|---|
| 2012/0231611 A1* | 9/2012 | Gatineau | C07D 211/12 438/478 |
| 2015/0004775 A1 | 1/2015 | Huang et al. | |
| 2015/0252257 A1* | 9/2015 | Harris | H01L 21/024 75/392 |

FOREIGN PATENT DOCUMENTS

| | | |
|---|---|---|
| WO | 2007143197 A2 | 12/2007 |
| WO | 20080133660 A2 | 11/2008 |
| WO | 20090151515 A1 | 12/2009 |
| WO | 2012021643 A2 | 2/2012 |
| WO | 2012099653 A2 | 7/2012 |
| WO | 20120158832 A2 | 11/2012 |

(Continued)

OTHER PUBLICATIONS

De Mello et al., "An Improved Experimental Determination of External Photoluminescence Quantum Efficiency"; Adv. Mater.; 1997; 9; No. 3; 230-232.

(Continued)

*Primary Examiner* — Michelle Mandala
(74) *Attorney, Agent, or Firm* — Cantor Colburn LLP

(57) ABSTRACT

Disclosed are a semiconductor nanocrystal comprising an alloy comprising an alloy including a Group III element, a Group II element, antimony, and a Group VI element; a method for preparing a semiconductor nanocrystal comprising an alloy comprising an alloy including a Group III element, a Group II element, antimony, and a Group VI element, and a light emitting device including an emissive material comprising a semiconductor nanocrystal comprising an alloy comprising an alloy including a Group III element, a Group II element, antimony, and a Group VI element.

14 Claims, 3 Drawing Sheets

(56) References Cited

FOREIGN PATENT DOCUMENTS

| WO | 2013040365 A2 | 3/2013 |
| WO | 2013173409 A1 | 11/2013 |

OTHER PUBLICATIONS

Evans et al., "Synthesis and Use of Tris(trimethylsilyl)antimony for the Preparation of InSb Quantum Dots" Chemistry of Materials, vol. 20, No. 18, Sep. 23, 2008 (4 pages).

* cited by examiner

Type: Default
ID:

Processing option : All elements analysed (Normalised)

All results in atomic%

| Spectrum | In S | S | Zn | In | Sb |
|---|---|---|---|---|---|
| Spectrum 1 | Yes | 9.890423 | 6.773593 | 31.93941 | 51.39658 |
| Spectrum 2 | Yes | 11.0432 | 8.127654 | 36.94126 | 43.88788 |
| Spectrum 3 | Yes | 11.17514 | 8.444011 | 35.97779 | 44.40305 |
| Mean | | 10.70292 | 7.781753 | 34.95282 | 46.56251 |
| Std. deviation | | 0.706732 | 0.887305 | 2.653782 | 4.194351 |
| Max. | | 11.17514 | 8.444011 | 36.94126 | 51.39658 |
| Min. | | 9.890423 | 6.773593 | 31.93941 | 43.88788 |

SEMICONDUCTOR NANOCRYSTALS, A METHOD FOR PREPARING A SEMICONDUCTOR NANOCRYSTAL, AND PRODUCT INCLUDING SAME

This application claims priority to U.S. Provisional Patent Application No. 62/204,890, filed 13 Aug. 2015, which is hereby incorporated herein by reference in its entirety for all purposes.

FEDERALLY SPONSORED RESEARCH OR DEVELOPMENT

This invention was made with Government support under Research Grant No. D11AP00285 (formerly N11AP20028) awarded by the Defense Advanced Research Projects Agency. The Government has certain rights in the invention.

TECHNICAL FIELD OF THE INVENTION

The present invention relates to the field of nanotechnology.

SUMMARY OF THE INVENTION

The present invention relates to methods for preparing semiconductor nanocrystals, semiconductor nanocrystals prepared thereby, and end-use applications including semiconductor nanocrystals.

In accordance with one aspect of the present invention, there is provided a method for preparing a semiconductor nanocrystal comprising an alloy including a Group III element, a Group II element, antimony, and a Group VI element, the method comprising:

heating a first mixture comprising a Group II-precursor and a Group III-precursor at a first temperature, adding an Sb-precursor and a Group VI-precursor to the first mixture at a second temperature to form a reaction mixture, the Sb-precursor comprising a composition represented by the formula (I):

$$Sb(Y(R)_3)_3 \quad (I)$$

where Y is Ge, Sn, or Pb; and each R, independently, is alkyl, alkenyl, alkynyl, cycloalkyl, cycloalkenyl, heterocyclyl, aryl, or heteroaryl, wherein each R, independently, is optionally substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl at a first temperature to form a reaction mixture; and heating the reaction mixture at a third temperature to form the semiconductor nanocrystal comprising the alloy including a Group III element, a Group II element, antimony, and a Group VI element.

Preferably the Sb-precursor can be tris(trimethylgermyl)stibine; tris(trimethylstannyl)stibine; or tris(trimethylplumbyl)stibine.

The method can further include overcoating the above-described semiconductor nanocrystal with one or more inorganic semiconductor materials. An overcoating can comprise one or more layers, at least one of which comprises an inorganic semiconductor material. When an overcoating includes more than one layer, any layer can comprise a material that is the same as or different from that included in another layer. In certain embodiments, a semiconductor nanocrystal is isolated from the reaction medium prior to overcoating.

In accordance with another aspect of the present invention, there is provided a semiconductor nanocrystal comprising an alloy comprising an alloy including a Group III element, a Group II element, antimony, and a Group VI element.

In accordance with another aspect of the present invention, there is provided a light emitting device including an emissive material comprising a semiconductor nanocrystal taught herein.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
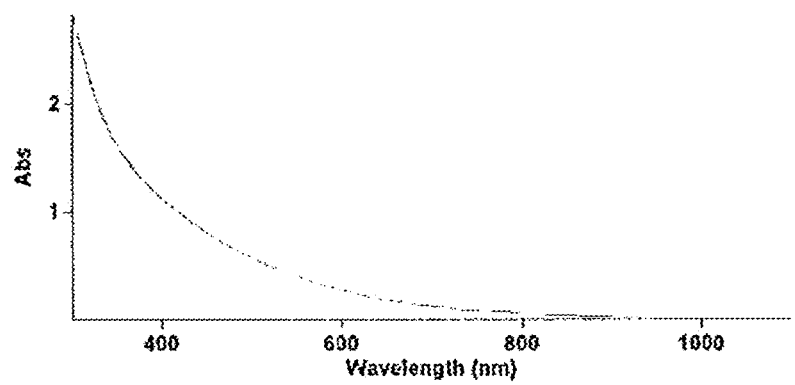
FIGS. 1-3 graphically depict data relating to semiconductor nanocrystals prepared generally in accordance with the method described in the Example.

For a better understanding of the present invention, together with other advantages and capabilities thereof, reference is made to the following disclosure and appended claims in connection with the above-described drawings.

DETAILED DESCRIPTION OF THE INVENTION

For a better understanding of the present invention, together with advantages and capabilities thereof, reference is made to the following disclosure.

Various aspects and embodiments of the present inventions will be further described in the following detailed description.

The present invention relates to a semiconductor nanocrystal comprising an alloy comprising an alloy including a Group III element, a Group II element, antimony, and a Group VI element, a method for preparing same, and products including same.

In one aspect, a semiconductor nanocrystal comprising an alloy including indium, zinc, antimony, and sulfur can emit light with a peak emission in the near-infra-red or infrared region of the electromagnetic spectrum.

A semiconductor nanocrystal described herein may further include an overcoating comprising an inorganic semiconductor material. An overcoating can include one or more layers, at least one of which comprises an inorganic semiconductor material. When an overcoating includes more than one layer, any layer can comprise a material that is the same as or different from that included in another layer. The present invention further also relates to end-use applications of semiconductor nanocrystals formed by the methods described herein.

A semiconductor nanocrystal may also be referred to herein as a semiconductor nanoparticle, a nanocrystal, or a quantum dot.

As described above, in accordance with one aspect of the present invention, a method for preparing a semiconductor nanocrystal comprising an alloy including a Group III element, a Group II element, antimony, and a Group VI element, provided a method for preparing a semiconductor nanocrystal comprising an alloy including a Group III element, a Group II element, antimony, and a Group VI element, the method comprising:

heating a first mixture comprising a Group II-precursors and a Group III-precursor at a first temperature, adding an Sb-precursor and a Group VI-precursor to the first mixture at a second temperature to form a reaction mixture, the Sb-precursor comprising a composition represented by the formula (I):

$$Sb(Y(R)_3)_3 \qquad (I)$$

where Y is Ge, Sn, or Pb; and each R, independently, is alkyl, alkenyl, alkynyl, cycloalkyl, cycloalkenyl, heterocyclyl, aryl, or heteroaryl, wherein each R, independently, is optionally substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl at a first temperature to form a reaction mixture; and heating the reaction mixture at a third temperature to form the semiconductor nanocrystal comprising an alloy including a Group III element, a Group II element, antimony, and a Group VI element.

In certain embodiments, the Sb-precursor comprises tris (trimethylgermyl)stibine; tris(trimethylstannyl)stibine; or tris(trimethylplumbyl)stibine.

Group II elements include the elements of Group IIB (e.g., Zn, Cd, Hg) of the Periodic Table.

Group III elements include the elements of Group IIIA (e.g., Al, Ga, In, Tl) of the Periodic Table.

Group VI elements include the elements of Group VIA (e.g., O, S, Se, Te) of the Periodic Table.

In the methods described herein, Group II-, Group III-, and Group IV-pre-cursors are selected based on the Group II, Group III, and Group VI elements to be included, in addition to antimony, in the desired composition of the semiconductor nanocrystal to be prepared.

Examples of Group II precursors include, but are not limited to, Group II elements (oxidation state 0), covalent compounds, ionic compounds, and/or coordination complexes, that serve as a source for a Group II element(s) in the resulting nanocrystal. For example, a Group II precursor can constitute a wide range of substances, including, but not limited to, a metal oxide, a metal carbonate, a metal bicarbonate, a metal sulfate, a metal sulfite, a metal phosphate, metal phosphite, a metal phosphonate, a metal halide, a metal carboxylate, other metal salts, a metal alkoxide, a metal thiolate, a metal amide, a metal imide, a metal alkyl, a metal aryl, other organometallic compounds, a metal coordination complex, a metal solvate, etc., wherein the metal comprises a Group II element. For example, non-limiting examples of zinc precursors include Zn(II) carboxylates (e.g., but not limited to, acetates, stearates, etc.), dialkyl zinc (ZnR$_2$)(wherein R=methyl, ethyl, propyl, butyl, pentyl, hexyl, isopropyl, isobutyl, tert-butyl, etc.). Other Group II precursors can be readily ascertained by one of ordinary skill in the art.

Optionally, a mixture of two or more different precursors for the same Group II element can be included. For example, a mixture of zinc acetate and zinc stearate can be included as the Zn precursor in the mixture.

In certain embodiments, a Group II-precursor can comprise a mixture of precursors for two or more different Group II elements.

Examples of Group III precursors include, but are not limited to, Group III elements (oxidation state 0), covalent compounds, ionic compounds, and/or coordination complexes, that serve as a source for a Group III element(s) in the resulting nanocrystal. For example, a Group III precursor can constitute a wide range of substances, including, but not limited to, a metal oxide, a metal carbonate, a metal bicarbonate, a metal sulfate, a metal sulfite, a metal phosphate, metal phosphite, a metal phosphonate, a metal halide, a metal carboxylate, other metal salts, a metal alkoxide, a metal thiolate, a metal amide, a metal imide, a metal alkyl, a metal aryl, other organometallic compounds, a metal coordination complex, a metal solvate, etc., wherein the metal comprises a Group III element. For example, non-limiting examples of indium precursors include In(III) carboxylates (e.g., but not limited to, acetates (including, but not limited to, In(III) acetate, In(III) trifluoroacetate), stearates, etc.), trialkyl indium (InR$_3$) (wherein R=methyl, ethyl, propyl, butyl, pentyl, hexyl, isopropyl, isobutyl, tert-butyl, etc.); non-limiting examples of gallium precursors include Ga(III) carboxylates (e.g., but not limited to, acetates (including, but not limited to, Ga(III) acetate, Ga(III) trifluoroacetate, trialkyl gallium (GaR$_3$) (wherein R=methyl, ethyl, propyl, butyl, pentyl, hexyl, isopropyl, isobutyl, tert-butyl, etc.). Other Group III precursors can be readily ascertained by one of ordinary skill in the art.

Optionally, a mixture of two or more different precursors for the same Group III element can be included.

In certain embodiments, a Group III-precursor can comprise a mixture of precursors for two or more different Group III elements.

Examples of Group VI precursors include Group VI elements (oxidation state 0), covalent compounds, or ionic compounds that serve as a source for a Group VI element(s) in the resulting nanocrystal. For example, non-limiting examples Group VI precursors include comprise oxygen, sulfur, selenium, tellurium, or mixtures thereof, reactive chalcogenide sources, such as bis(trimethylsilyl) selenide (TMS)$_2$Se, bis(trimethylsilyl)sulfide (TMS)$_2$S, H$_2$S, octadecene-Se, (ODE/Se), octadecene-S (ODE/s), amine-Se, amine-S, oxygen-treated tertiary phosphine chalcogenide and mixtures thereof, secondary phosphine chalcogenides (including secondary phosphine sulfides, secondary phosphine selenides, secondary phosphine tellurides, a secondary phosphine oxides, dialkyl phosphine chalcogenides (including iisobutylphosphine selenides, diisobutylphosphine sulfides, diphenylphosphine selenides, diphenylphosphine sulfides or mixtures thereof), or mixtures of any of the above. Other Group VI precursors can be readily ascertained by one of ordinary skill in the art.

Optionally, a mixture of two or more different precursors for the same Group VI element can be included.

In certain embodiments, a Group VI-precursor can comprise a mixture of precursors for two or more different Group VI elements.

Within the scope of the present invention, Group II-, Group III-, and Group IV-pre-cursors are selected based on the Group II, Group III, and Group VI elements to be included, in addition to antimony, in the desired composition of the semiconductor nanocrystal.

The first mixture can further include a liquid medium.

The Sb-precursor and Group VI precursor(s) can further be included in a liquid medium when added to the first mixture.

Examples of a liquid medium include coordinating solvents, weakly coordinating solvents, and non-coordinating solvents. A solvent can also comprise a mixture of solvents. Preferably, the liquid medium comprises a non-aqueous solvent. Examples of non-coordinating solvents that can be desirable for use in the methods taught herein include, but are not limited to, squalane, octadecane, or any other saturated hydrocarbon molecule. A coordinating solvent is a compound having a donor lone pair, for example, a lone electron pair available to coordinate to a surface of a semiconductor nanocrystal. Solvent coordination can stabilize the growing of semiconductor nanocrystal cores or growing of an overcoating thereon. Examples of coordinating solvents include, without limitation, alkyl phosphines, alkyl phosphine oxides, alkyl phosphonic acids, or alkyl phosphinic acids, however, other coordinating solvents, such as pyridines, furans, and amines may also be suitable for the semiconductor nanocrystal (e.g., semiconductor nanocrystal) production. Additional examples of suitable coordinating solvents include pyridine, tri-n-octyl phosphine (TOP), tri-n-octyl phosphine oxide (TOPO) and tris-hydroxylpropylphosphine (tHPP), tributylphosphine, tri(dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, N-dodecylpyrrolidone (NDP), and hexyl octanoate. In certain embodiments, technical grade TOPO can be used. Other solvents for use in the methods taught herein can be readily ascertained by one of ordinary skill in the art.

In certain aspects, a non-coordinating solvent may be preferred.

According to one aspect, the first mixture can further include one or more carboxylic acid compounds.

As used herein, a "carboxylic acid compound" refers to a compound including at least one carboxylic acid or carboxylate group. Carboxylic acid compounds may have one or more alkyl and/or aryl groups, that, in either or both cases, can be independently substituted or unsubstituted. In certain embodiments a carboxylic compound can be a mixture including one or more carboxylic acid compounds. Examples of carboxylic acid compounds include, but are not limited to, $CH_3(CH_2)_nC(O)OH$ wherein n=1-18, e.g, $CH_3(CH_2)_nC(O)OH$ wherein n=6-18, and carboxylate salts thereof. Additional examples of particular carboxylic acid compounds include octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid or oleic acid, and carboxylate salts thereof. According to a certain aspect, the carboxylic acid compound is a myristic acid compound or a myristate salt. Other carboxylic acid compounds for use in the method can be identified by one of ordinary skill in the art.

Exemplary carboxylic acid compounds include, but are not limited to, myristic acid and stearic acid.

In certain embodiments including a carboxylic acid in the first mixture, the Group III-precursors, Group II-precursors, Sb-precursors, Group VI-precursors, and carboxylic acid are included in the reaction mixture in amounts to provide a molar ratio of Group III elements to Group II elements to antimony to Group VI elements to carboxylic acid group that is approximately 1 to 2 to 1 to 0.5 to 3.

According to one aspect, the precursors, first mixture, and the reaction mixture are oxygen free.

According to one aspect, each of the precursors and liquid media included in the method are degassed.

According to one aspect, the method is carried out under oxygen-free conditions.

According to one aspect, the antimony-precursor and Group VI-precursors can be added as a mixture.

Within the scope of the present method, the reaction mixture includes various precursors that are selected, and included in the reaction mixture in amounts selected, to prepare a semiconductor nanocrystal core having the desired composition, size, and emission wavelength. Such determination is within the skill of the person of ordinary skill in the relevant art.

In certain embodiments, the Group III-precursors, Group II-precursors, Sb-precursors, Group VI-precursors are included in the reaction mixture in amounts to provide a molar ratio of Group III elements to Group II elements to antimony to Group VI elements that is approximately 1 to 2 to 1 to 0.5.

The method of the present invention includes a step comprising heating a first mixture comprising one or more M-precursors and one or more A-precursors at a first temperature.

In one aspect, the first temperature is can be greater than room temperature up to about 150° C. An exemplary first temperature is within the range from about 75° C. to about 125° C. A specific exemplary first temperature is about 100° C. Other temperatures within the scope of the above ranges can also be used. It may be determined that other temperatures outside of the above ranges may be useful or desirable.

The method of the present invention also includes a step comprising adding an Sb-precursor and a Group VI-precursor to the first mixture at a second temperature to form a reaction mixture, the Sb-precursor comprising a composition represented by the formula (I):

$$Sb(Y(R)_3)_3 \qquad (I)$$

where Y is Ge, Sn, or Pb; and each R, independently, is alkyl, alkenyl, alkynyl, cycloalkyl, cycloalkenyl, heterocyclyl, aryl, or heteroaryl, wherein each R, independently, is optionally substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl at a first temperature to form a reaction mixture.

In one aspect, the second temperature is greater than 150° C., e.g., greater than 220° C., greater than or equal to 275° C. An exemplary second temperature is within the range from about 250° C. to about 325° C., e.g., 285° C. to about 320° C. A specific exemplary second temperature is about 315° C. Other temperatures within the scope of the above ranges can also be used. It may be determined that other temperatures outside of the above ranges may be useful or desirable.

The method of the present invention also includes a step comprising heating the reaction mixture at a third temperature to form the semiconductor nanocrystal comprising the alloy including a Group III element, a Group II element, antimony, and a Group VI element.

In one aspect, the third temperature is greater than or equal to 250° C., e.g., in a range from about 250° C. to about 325° C., in a range from about 250° C. to about to 300° C. An exemplary third temperature is within the range from about 260° C. to about 290° C., e.g., 280° C. to about 290° C. A specific exemplary second temperature is about 285° C. Other temperatures within the scope of the above ranges can also be used. It may be determined that other temperatures outside of the above ranges may be useful or desirable.

In a certain embodiments, the reacting step is carried out at a single second temperature, for example, the temperature control is not changed until the reaction is terminated or ended.

In various aspects, the mixture and/or reaction mixture can further include one or more ligands.

Ligands can be derived from a coordinating solvent that may be included in the reaction mixture during the growth process. Alternatively, ligands can be added to the reaction mixture or ligands can be derived from a reagent or precursor included in the reaction mixture for synthesizing the semiconductor nanocrystals. In certain embodiments, semiconductor nanocrystals can include more than one type of ligand attached to an outer surface.

Examples of ligands include, but are not limited to, fatty acids and other carboxylic acid compounds, phosphonic acid compounds, amine compounds, phosphines, phosphine oxides, etc. Examples of additional ligands include fatty acids, long chain fatty acids such as oleic acid, alkyl phosphines, alkyl phosphine oxides, alkyl phosphonic acids, or alkyl phosphinic acids, pyridines, furans, and amines More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques readily ascertainable by the skilled artisan.

The present invention will be further clarified by the following non-limiting examples, which are intended to be exemplary of the present invention.

EXAMPLE

Following is an example for preparing semiconductor nanocrystals comprising an alloy including indium, zinc, antimony, and sulfur:
1. Degas a mixture of 1.905 mmoles indium (III) acetate, 3.81 mmoles zinc stearate, 5.715 myristic acid, and 60 milliliters (ml) 1-octadecene at 100° C. for 1 hour;

2. Heat the mixture to 315° C. and inject 1.905 mmoles tris(trimethylgermyl)stibene* ($Sb(GeMe_3)_3$) and 0.9525 mmoles 1-dodecanthiol in 10 ml Dowthem A; and
3. Adjust the temperature to, and heat, the reaction mixture at 285° C. for 2 hours.

* Tris(trimethylgermyl)stibene for use in the above Example is prepared as follows:
1. Mix 0.5 g (1.4 mmol) of tris(trimethylsilyl)stibine ($As(TMS)_3$) with 0.67 g (43 mmol) of chlorotrimethylgermane in an pre-weighed amber vial in a glove box.
2. Stir at room temperature for 24 hours.
3. Remove trimethylsilyl chloride (TMS-Cl) in vacuo with stirring for several hours.
4. Weigh vial to get reaction yield and determine % conversion.

Figure 2:
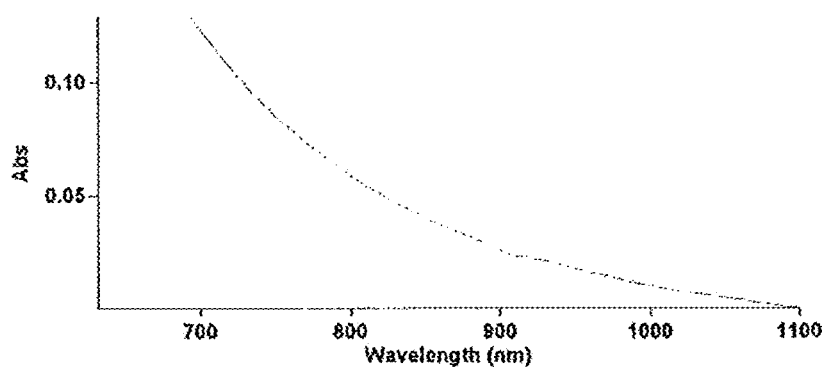
Figure 3:
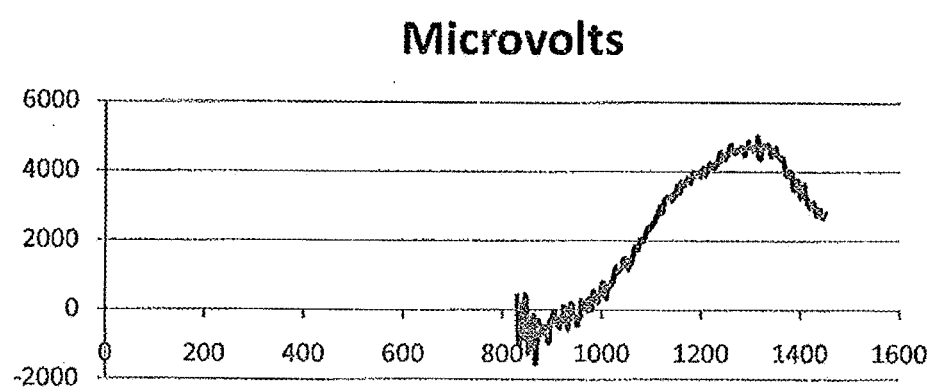

FIGS. 1-3 provide data for samples of semiconductor nanocrystals prepared generally as described in the above example.

Figures 4A, 4B:
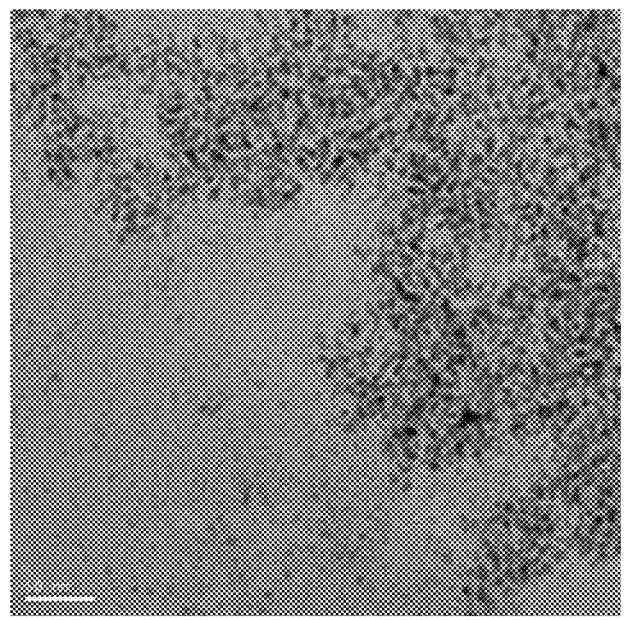
FIGS. 4A and 4B provide TEM results for semiconductor nanocrystals prepared generally in accordance with the method described in the Example.

FIGS. 4A and 4B provide TEM results for semiconductor nanocrystals prepared generally in accordance with the method described in the Example.

The present method to produce InSbZnS alloy nanoparticles avoids disadvantages that can occur in the synthesis of InSb nanocrystals via reaction between and Indium (III) precursor (TMI, In(III) salts, etc.) and tristrimethylsilyl antimonide. The instability of the antimonide precursor can result in formation of elemental antimony during the reaction. Alteration of the V precursor to the less reactive tris(trimethylgermyl)antimonide in making InSb nanocrystals can provide a system that avoids formation of elemental antimony under 220° C., but the materials so produced can result in the formation of insoluble material when heated above 220° C.

As mentioned above, the method described herein can further include growing an overcoating comprising one or more semiconductor materials over at least a portion of an outer surface of at least a portion of the semiconductor nanocrystal cores. A coating can further comprise one or more layers, each of which can be the same as, or different from, another layer in the coating.

In one aspect, overcoating comprises adding one or more overcoating precursors to the semiconductor nanocrystal cores included a liquid medium, and reacting the overcoating precursors to form an overcoating comprising one or more semiconductor materials over at least a portion of an outer surface of at least a portion of the semiconductor nanocrystal cores.

Optionally, the overcoating mixture can further include one or more ligands. Examples of such ligands can include, without limitation, ligands discussed elsewhere herein.

According to one aspect, the overcoating step carried out under oxygen-free conditions.

The overcoating can include one or more semiconductor materials having a composition different from the composition of the core and can have a band gap greater than the band gap of the core. The overcoat of a semiconductor material on a surface of the nanocrystal can include a Group II-VI compounds, Group II-V compounds, Group III-VI compounds, Group III-V compounds, Group IV-VI compounds, Group compounds, Group II-IV-VI compounds, and Group II-IV-V compounds, with Group I referring to Group IB (e.g., Cu, Ag, Au) of the Periodic Table, Group II referring to Group IIB (e.g., Zn, Cd, Hg) of the Periodic Table, Group III referring to Group IIIA (e.g., Al, Ga, In, Tl) of the Periodic Table, Group IV (e.g., Si, Ge) of the Periodic Table, Group V referring to Group VA (e.g., N, P, As, Sb) of the Periodic Table (Group V elements also known as pnictogens), and Group VI referring to Group VIA (e.g., O, S, Se, Te) of the Periodic Table (Group VI elements also known as chalcogens).

One or more overcoating precursors are selected to include those elements to be included in the semiconductor material of the desired overcoating. Amounts of the overcoating precursors are selected based on the desired overcoating thickness. Such selections are within the skill of the person of ordinary skill in the relevant art.

An overcoating can have a thickness from about one to about ten monolayers. An overcoating can also have a thickness greater than ten monolayers. In certain embodiments, more than one overcoating can be included on a core.

In certain embodiments, the surrounding overcoating or "shell" material can have a band gap greater than the band gap of the core material. In certain other embodiments, the surrounding shell material can have a band gap less than the band gap of the core material.

In one embodiment, for example, a liquid medium (e.g, a solvent discussed herein, or a mixture of solvents (e.g., an aromatic solvent (e.g., o-terphenyl) and a solvent (e.g., squalene)) is preferably treated to remove oxygen (e.g., by degassing and backfilling with nitrogen). Semiconductor nanocrystal cores that have been isolated and dispersed in an organic solvent (e.g., hexane) are added to the liquid medium under oxygen free conditions. One or more ligands can be added. Precursors for forming the desired overcoating material can be introduced into the liquid medium including the cores. Such introduction can be made, for example, by injection. The precursors can be added separately, which can be preferred in certain embodiments, or as a mixture. Such addition can be by controlled periodic additions using syringe pump. The overcoating step can be carried out under conditions sufficient for growing an overcoating of a desired thickness. For example, for growing a zinc sulfide overcoating, the overcoating can be carried out at a temperature greater than 200° C., e.g., 250° C., with the addition of the precursors (e.g., diethyl zinc and bis(trimethylsilyl)sulfide ($S(TMS)_2$) being initiated before the liquid medium including the cores reaches the desired temperature, e.g., infusion can be initiated when the temperature of the liquid medium including the cores reaches about 150° C. during the ramp of the temperature to the desired reaction temperature for the overcoating step. Optionally, additional ligands of an acidic nature (e.g., phosphonic acid ligands, including but not limited to benzylphosphonic acid) can be added, preferably by infusion at a controlled rate) after initiation of the infusion of the overcoating precursors. Following completion of the reaction, the overcoated cores are preferably isolated and purified under oxygen free conditions. Other temperatures can be used for carrying out the overcoating step and can be readily determined by the skilled artisan.

By adjusting the temperature of the reaction mixture during overcoating and monitoring the absorption spectrum of the core, overcoated materials controlled size distributions can be obtained.

In certain embodiments, the shell can be chosen so as to have an atomic spacing close to that of the "core" substrate.

The method can further include isolating or recovering the semiconductor nanocrystal cores from the reaction medium before further processing (e.g., before growth of an overcoating layer or shell on at least a portion of the outer surface of the semiconductor nanocrystal cores).

Size distribution during the reaction process can be estimated by monitoring the absorption or emission line widths of the particles. Modification of the reaction temperature in response to changes in the absorption spectrum of the particles allows the maintenance of a sharp particle size distribution during growth.

The particle size distribution of the semiconductor nanocrystals (including, e.g., semiconductor nanocrystals) can be further refined by size selective precipitation with a poor solvent for the semiconductor nanocrystals, such as methanol/butanol. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal (e.g., semiconductor nanocrystal) population preferably has no more than a 15% rms deviation from mean diameter, more preferably 10% rms deviation or less, and most preferably 5% rms deviation or less.

A semiconductor nanocrystal is capable of emitting light upon excitation. A semiconductor nanocrystal can be excited by irradiation with an excitation wavelength of light, by electrical excitation, or by other energy transfer.

In general, semiconductor nanocrystals, including those prepared by the present method, can have an average particle size in a range from about 1 to about 1000 nanometers (nm), and preferably in a range from about 1 to about 100 nm In certain embodiments, semiconductor nanocrystals have an average particle size in a range from about 1 to about 20 nm (e.g., such as about 2, 3, 4, 5, 6, 7, 8, 9, 10, 11, 12, 13, 14, 15, 16, 17, 18, 19, or 20 nm). In certain embodiments, semiconductor nanocrystals have an average particle size in a range from about 1 nm to about 20 nm or about 1 nm to about 10 nm Semiconductor nanocrystals can have an average diameter less than about 150 Angstroms (Å). In certain embodiments, semiconductor nanocrystals having an average diameter in a range from about 12 to about 150 Å can be particularly desirable. However, depending upon the composition, structure, and desired emission wavelength of the semiconductor nanocrystal, the average diameter may be outside of these ranges. The size of a nanocrystal can be determined, for example, by direct transmission electron microscope measurement. Other known techniques can also be used to determine nanocrystal size.

Nanocrystals can have various shapes. Examples of the shape of a nanocrystal include, but are not limited to, sphere, rod, disk, tetrapod, other shapes, and/or mixtures thereof.

A semiconductor material may comprise a compound, a doped compound, an undoped compound, and/or an alloy. A nanocrystal core surrounded by a shell is also referred to as having a "core/shell" structure.

Semiconductor nanocrystals can have optical properties arising from quantum confinement. The particular composition(s), structure, and/or size of a semiconductor nanocrystal can be selected to achieve the desired wavelength of light to be emitted from the semiconductor nanocrystal upon stimulation with a particular excitation source. Semiconductor nanocrystals may be tuned to emit light across the spectrum, e.g., ultraviolet, visible, or infra-red regions, by changing their size. A monodisperse population of semiconductor nanocrystals can emit light spanning a narrow range of wavelengths.

In certain embodiments, emission from a semiconductor nanocrystal described herein can be a Gaussian emission band, in visible, near-infrared, or infra-red regions of the spectrum by varying the size of the semiconductor nanocrystal, the composition of the semiconductor nanocrystal, or both. Spectral emissions having a full width at half max (FWHM) no greater than 100 nm can be desirable.

Semiconductor nanocrystals prepared according to the present invention may be used in various applications. According to one aspect, semiconductor nanocrystals prepared according to the methods described herein may be used in photoluminescent (PL) applications where semiconductor nanocrystals are excited optically to emit light. According to this aspect, exemplary applications include devices or systems including a light source and an emissive material comprising a semiconductor nanocrystal described herein, wherein at least a portion of the primary light emitted by the light source is converted to a different wavelength by the emissive material. Additional applications include plasma based systems where high energy plasma emission can excite a semiconductor nanocrystal downconverter, taggants, bio-labeling or imaging application, and barcoding or security/covert labeling applications. According to an additional aspect, semiconductor nanocrystals described herein may be included in electroluminescent (EL) applications where semiconductor nanocrystals are excited electrically and the excitation results in emission from the semiconductor nanocrystals. According to this aspect, exemplary applications include direct charge injection into the semiconductor nanocrystals generating semiconductor nanocrystal excited states and subsequent semiconductor nanocrystal emission, energy transfer from other semiconductor materials within the device to the semiconductor nanocrystals, generating an excited state and subsequent semiconductor nanocrystal emission and the like. According to an additional aspect, semiconductor nanocrystals prepared according to the present invention may be used in photovoltaic (PV) applications where the semiconductor nanocrystal materials are excited optically and the excitation results in current generation and/or a voltage due to carrier extraction from the semiconductor nanocrystals.

Additional information that may be useful in connection with the present disclosure and the inventions described herein is included in International Application No. PCT/US2007/024320 of Clough et al, filed 21 Nov. 2007, entitled "Nanocrystals Including A Group Ma Element And A Group Va Element, Method, Composition, Device And Other Products"; International Application No. PCT/US2012/038198, filed May 16, 2012, entitled "Method for Preparing Semiconductor Nanocrystals"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods", International Application No. PCT/US2011/047284 of Sadasivan et al, filed 10 Aug. 2011 entitled "Quantum Dot Based Lighting"; International Publication No. WO/2013/040365 of MIT, for "Highly Luminescent Semiconductor Nanocrystals", published 21 Mar. 2013; International Publication No. WO 2012/099653 of QD vision, Inc., for "Semiconductor Nanocrystals And Methods Of Preparation" published 26 Jul. 2012; International Publication No. WO 2013/173409 A1 of QD Vision, Inc. for "Semiconductor Nanocrystals And Methods Of Preparation", published 21 Nov. 2013; International Application No. PCT/US2007/13152 of Coe-Sullivan, et al., for "Light-Emitting Devices and Displays With Improved Performance", filed 4 Jun. 2007; and U.S. Patent Application Publication No. US2015/0004775 A1, or Huang, et al., published 1 Jan. 2015; each of the foregoing being hereby incorporated herein by reference in its entirety.

Solid state external quantum efficiency" (also referred to herein as "EQE" or "solid state photoluminescent efficiency") can be measured in a 12" integrating sphere using a NIST traceable calibrated light source, using the method developed by de Mello et al., *Advanced Materials* 9(3):230 (1997), which is hereby incorporated by reference. Such measurements can also be made with a QEMS from LabSphere (which utilizes a 4 inch sphere; e.g. QEMS-2000: World Wide Website laser2000.nl/upload/documenten/fop_21-en2.pdf).

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for preparing a semiconductor nanocrystal comprising an alloy including a Group III element, a Group II element, antimony, and a Group VI element, the method comprising:
heating a first mixture comprising a Group II-precursor and a Group III-precursor at a first temperature,
adding an Sb-precursor and an Group VI-precursor to the first mixture at a second temperature to form a reaction mixture, the Sb-precursor comprising a composition represented by the formula (1):

where Y is Ge, Sn, or Pb; and each R, independently, is alkyl, alkenyl, alkynyl, cycloalkyl, cycloalkenyl, heterocyclyl, aryl, or heteroaryl, wherein each R, independently, is optionally substituted by 1 to 6 substituents independently selected from hydrogen, halo, hydroxy, nitro, cyano, amino, cycloalkyl, cycloalkenyl, alkoxy, acyl, thio, or thioalkyl; and heating the reaction mixture at a third temperature to form the semiconductor nanocrystal comprising the alloy including a Group III element, a Group II element, antimony, and a Group VI element.

2. A method in accordance with claim 1 wherein the first temperature is greater than room temperature but less than about 150° C.

3. A method in accordance with claim 1 wherein the second temperature is greater than 220° C.

4. A method in accordance with claim 1 wherein the third temperature is less than 325° C.

5. A method in accordance with claim 1 wherein the first temperature is in a range from about 75° C. to about 125° C.

6. A method in accordance with claim 1 wherein the second temperature is in a range from about 250° C. to about 325° C.

7. A method in accordance with claim 1 wherein the third temperature is in a range from about 260° C. to about 300° C.

8. A method in accordance with claim 1 wherein the mixture further includes a carboxylic acid compound.

9. A method in accordance with claim 1 wherein the molar ratio of Group III elements to Group II elements to antimony to Group VI elements included in the reaction mixture is 1 to 2 to 1 to 0.5.

10. A method in accordance with claim 1 further including overcoating the semiconductor nanocrystal cores with one or more morganic semiconductor materials.

11. A method in accordance with claim 1 wherein the Group III element comprises aluminum, gallium, indium, or thallium.

12. A method in accordance with claim 1 wherein the Group II element comprises zinc, cadmium, or mercury.

13. A method in accordance with claim 1 wherein the Group VI element comprises oxygen, sulfur, selenium, or tellurium.

14. A method in accordance with claim 1 wherein the Group III element comprises indium, the Group II element comprises zinc, and the Group VI element comprises sulfur.

* * * * *